US007592941B2

(12) United States Patent
Ohkuri et al.

(10) Patent No.: US 7,592,941 B2
(45) Date of Patent: Sep. 22, 2009

(54) SIGNAL PROCESSING APPARATUS AND SIGNAL PROCESSING METHOD

(75) Inventors: Kazunobu Ohkuri, Kanagawa (JP); Kohei Asada, Kanagawa (JP); Ayataka Nishio, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/966,168

(22) Filed: Dec. 28, 2007

(65) Prior Publication Data

US 2008/0186218 A1 Aug. 7, 2008

(30) Foreign Application Priority Data

Feb. 5, 2007 (JP) ............................ 2007-025920

(51) Int. Cl.
*H03M 1/12* (2006.01)

(52) U.S. Cl. ...................................... 341/155; 341/143

(58) Field of Classification Search ................. 341/144, 341/155, 143; 375/229, 295, 350
See application file for complete search history.

(56) References Cited

U.S. PATENT DOCUMENTS

| | | | | |
|---|---|---|---|---|
| 4,542,369 | A * | 9/1985 | Kasuga | 341/144 |
| 5,276,740 | A | 1/1994 | Inanaga et al. | |
| 7,330,739 | B2 * | 2/2008 | Somayajula | 455/570 |
| 2005/0226437 | A1 * | 10/2005 | Pellegrini et al. | 381/77 |
| 2008/0152169 | A1 * | 6/2008 | Asada et al. | 381/107 |

FOREIGN PATENT DOCUMENTS

| | | |
|---|---|---|
| JP | 3-96199 | 4/1991 |
| JP | 3-214892 | 9/1991 |

OTHER PUBLICATIONS

U.S. Appl. No. 11/936,894, filed Nov. 8, 2007, Asada et al.
U.S. Appl. No. 11/865,419, filed Oct. 1, 2007, Asada et al.
U.S. Appl. No. 11/865,354, filed Oct. 1, 2007, Asada.
U.S. Appl. No. 11/875,374, filed Oct. 19, 2007, Asada.
U.S. Appl. No. 11/936,882, filed Nov. 8, 2007, Asada et al.
U.S. Appl. No. 11/936,876, filed Nov. 8, 2007, Asada et al.
U.S. Appl. No. 11/952,468, filed Dec. 7, 2007, Asada et al.
U.S. Appl. No. 12/015,824, filed Jan. 17, 2008, Asada et al.

* cited by examiner

*Primary Examiner*—Brian Young
(74) *Attorney, Agent, or Firm*—Oblon, Spivak, McClelland, Maier & Neustadt, L.L.P.

(57) ABSTRACT

Disclosed herein is a signal processing apparatus including: analog-to-digital conversion means for performing delta sigma modulation of generating a digital signal having a predetermined sampling frequency and a predetermined quantization bit rate of one or more bits based on an input analog signal; signal processing means including a digital filter having a characteristic for outputting a digital signal having a sampling frequency n×Fs (Fs is a reference sampling frequency) and a quantization bit rate of a bits (a is a natural number greater than one) based on the above digital signal; and digital-to-analog conversion means including a part for performing delta sigma modulation for outputting a digital signal having a sampling frequency n×Fs and a quantization bit rate of b bits (b is a natural number greater than zero and less than a) based on a digital signal outputted from the signal processing means.

19 Claims, 8 Drawing Sheets

SIGNAL PROCESSING APPARATUS AND SIGNAL PROCESSING METHOD

CROSS REFERENCES TO RELATED APPLICATIONS

The present invention contains subject matter related to Japanese Patent Application JP 2007-025920, filed in the Japanese Patent Office on Feb. 5, 2007, the entire contents of which being incorporated herein by reference.

BACKGROUND OF THE INVENTION

1. Field of the Invention

The present invention relates to a signal processing apparatus for performing signal processing on an audio signal in accordance with a given purpose, and a method therefor.

2. Description of the Related Art

A so-called noise cancellation system is known that is implemented on a headphone device and used to actively cancel an external noise that comes when a sound of content, such as a tune, is being reproduced via the headphone device. Such noise cancellation systems have been put to practical use. Such noise cancellation systems are broadly classified into a feedback system and a feedforward system.

For example, Japanese Patent Laid-open No. Hei 3-214892 describes a structure of a feedback noise cancellation system in which a noise inside a sound tube worn on ears of a user is picked up by a microphone unit provided close to an earphone unit within the sound tube, a phase-inverted audio signal of the noise is generated, and this audio signal is outputted as sound via the earphone unit, so that the external noise is reduced.

Meanwhile, Japanese Patent Laid-open No. Hei 3-96199 describes a structure of a feedforward noise cancellation system in which, in essence, a noise is picked up by a microphone attached to the exterior of a headphone device, a characteristic based on a desired transfer function is given to an audio signal of the noise, and a resultant audio signal is outputted from the headphone device.

SUMMARY OF THE INVENTION

Noise cancellation systems in consumer headphone devices in practical use today are composed of analog circuits, whether they are in accordance with the feedback system or the feedforward system.

In order for a noise cancellation effect of the noise cancellation system to be achieved effectively, difference in phase between an external unwanted sound picked up by, for example, a microphone and a sound outputted from a driver for canceling this unwanted sound should be restricted within a certain range. In other words, in the noise cancellation system, a time between input of the external unwanted sound and output of a corresponding cancellation-use sound should be restricted within a certain range. That is, a response speed should be sufficiently fast.

When the noise cancellation system is constructed using a digital circuit, however, an A/D converter and a D/A converter need be provided at input and output of the noise cancellation system. A/D converters and D/A converters that are widely used today have too long processing time and cause too long delays to be adopted in the noise cancellation system, and it is difficult to achieve an effective noise cancellation effect therewith. In military and industrial fields, for example, A/D converters and D/A converters that have a significantly high sampling frequency and cause slight delays are used, but these A/D converters and D/A converters are very expensive, and it is not practical to adopt them in consumer devices. This is the reason why the noise cancellation systems today are constructed using an analog circuit instead of a digital circuit.

Replacement of the analog circuit by the digital circuit makes it easy to change or switch characteristics or an operation mode, without the need to physically change a constant in a component or replace a component, for example. In addition, in the case of an audio-related system such as the noise cancellation system, the replacement of the analog circuit by the digital circuit has many advantages, such as expected further improvement in sound quality.

As such, the present invention aims to allow a noise cancellation system in, for example, a consumer headphone device to be constructed using a digital circuit and achieve a practically sufficient noise cancellation effect.

According to one embodiment of the present invention, there is provided a signal processing apparatus including: analog-to-digital conversion means for performing a first delta sigma modulation process of generating a digital signal having a predetermined sampling frequency and a predetermined quantization bit rate of one or more bits based on an input analog signal; signal processing means including a digital filter having a predetermined characteristic for outputting a digital signal having a sampling frequency of n×Fs where n is a natural number and Fs is a predetermined reference sampling frequency and a predetermined quantization bit rate of a bits where a is a natural number greater than one based on the digital signal generated by the analog-to-digital conversion means; and digital-to-analog conversion means including a part for performing a second delta sigma modulation process for outputting a digital signal having a sampling frequency of n×Fs and a predetermined quantization bit rate of b bits where b is a natural number greater than zero and less than a based on a digital signal outputted from the signal processing means.

In the above embodiment, first, the output of the (first) delta sigma modulation process is obtained as an output as a result of an analog-to-digital conversion (A/D conversion) process. Then, as signal processing, the digital signal thus obtained is caused to pass through the digital filter in which the filter characteristic is set in accordance with at least a predetermined purpose. The signal outputted as a result of this signal processing is a digital signal with a sampling frequency of n×Fs and a quantization bit rate of a bits where a is a natural number greater than one. A D/A conversion part for accepting input of at least the signal outputted from the digital filter and converting this signal into an analog signal includes the part for performing the (second) delta sigma modulation process, and the digital signal obtained as a result of the above signal processing is inputted to this part for performing the (second) delta sigma modulation process. As a result of the (second) delta sigma modulation process, the digital signal with a sampling frequency of n×Fs and a predetermined quantization bit rate of b bits where b is a natural number greater than zero and less than a is obtained.

For example, in a known device for performing an A/D conversion process including a delta sigma modulation process, a signal obtained after the delta sigma modulation process is allowed to pass through a decimation filter, and a digital signal with a reference sampling frequency Fs and a quantization bit rate of two or more bits, for example, is outputted from the device. Meanwhile, in a known device for performing a D/A conversion process including a delta sigma modulation process, first, a signal with the reference sampling frequency Fs (=1 Fs) and a quantization bit rate of two or more bits is subjected to oversampling so as to have a sampling frequency in accord with the delta sigma modulation process.

In comparison to a digital signal processing apparatus having the above known devices for performing the A/D conversion process and the D/A conversion process for its input and output, the signal processing apparatus in accordance with the present invention has the following features. That is, in the A/D conversion process, the signal is not caused to pass through the decimation filter, and the signal obtained as a result of the delta sigma modulation process is inputted to the subsequent part (i.e., the signal processing means) for performing the signal processing in accordance with the predetermined purpose. In addition, when the digital signal outputted from the signal processing means is converted into an analog signal, the digital signal is inputted to the part for performing the delta sigma modulation process without being subjected to the oversampling process. In other words, in the signal processing apparatus in accordance with the present invention, the parts for converting the analog signal into the digital signal, subjecting this digital signal to the signal processing in accordance with the predetermined purpose, and converting the resulting digital signal into the analog signal omit decimation in the A/D conversion process and the oversampling process in the D/A conversion process. Due to the omission of at least these processes, a signal propagation time is reduced in the signal processing apparatus in accordance with the present invention, which includes a signal processing system for [A/D conversion–digital signal processing–D/A conversion].

According to another embodiment of the present invention, there is provided a signal processing method including: an analog-to-digital conversion step of performing a first delta sigma modulation process of generating a digital signal having a predetermined sampling frequency and a predetermined quantization bit rate of one or more bits based on an input analog signal; a signal processing step, performed by a digital filter having a predetermined characteristic, of outputting a digital signal having a sampling frequency of n×Fs where n is a natural number and Fs is a predetermined reference sampling frequency and a predetermined quantization bit rate of a bits where a is a natural number greater than one based on the digital signal generated in the analog-to-digital conversion step; and a digital-to-analog conversion step, performed by a part for performing a second delta sigma modulation process, of outputting a digital signal having a sampling frequency of n×Fs and a predetermined quantization bit rate of b bits where b is a natural number greater than zero and less than a based on a digital signal obtained in the signal processing step.

With the signal propagation time in the signal processing apparatus in accordance with the present invention, a condition of the response speed for the signal processing system in the noise cancellation system in the headphone device is satisfied. That is, it becomes possible to implement a noise cancellation system using a digital circuit(s) easily. The implementation of the noise cancellation system using the digital circuit(s) makes it possible to implement a feature that is difficult to implement in a noise cancellation system using an analog circuit(s), and also achieve improved sound quality, for example, resulting in increased usefulness for users.

DETAILED DESCRIPTION OF THE PREFERRED EMBODIMENTS

Figure 1:
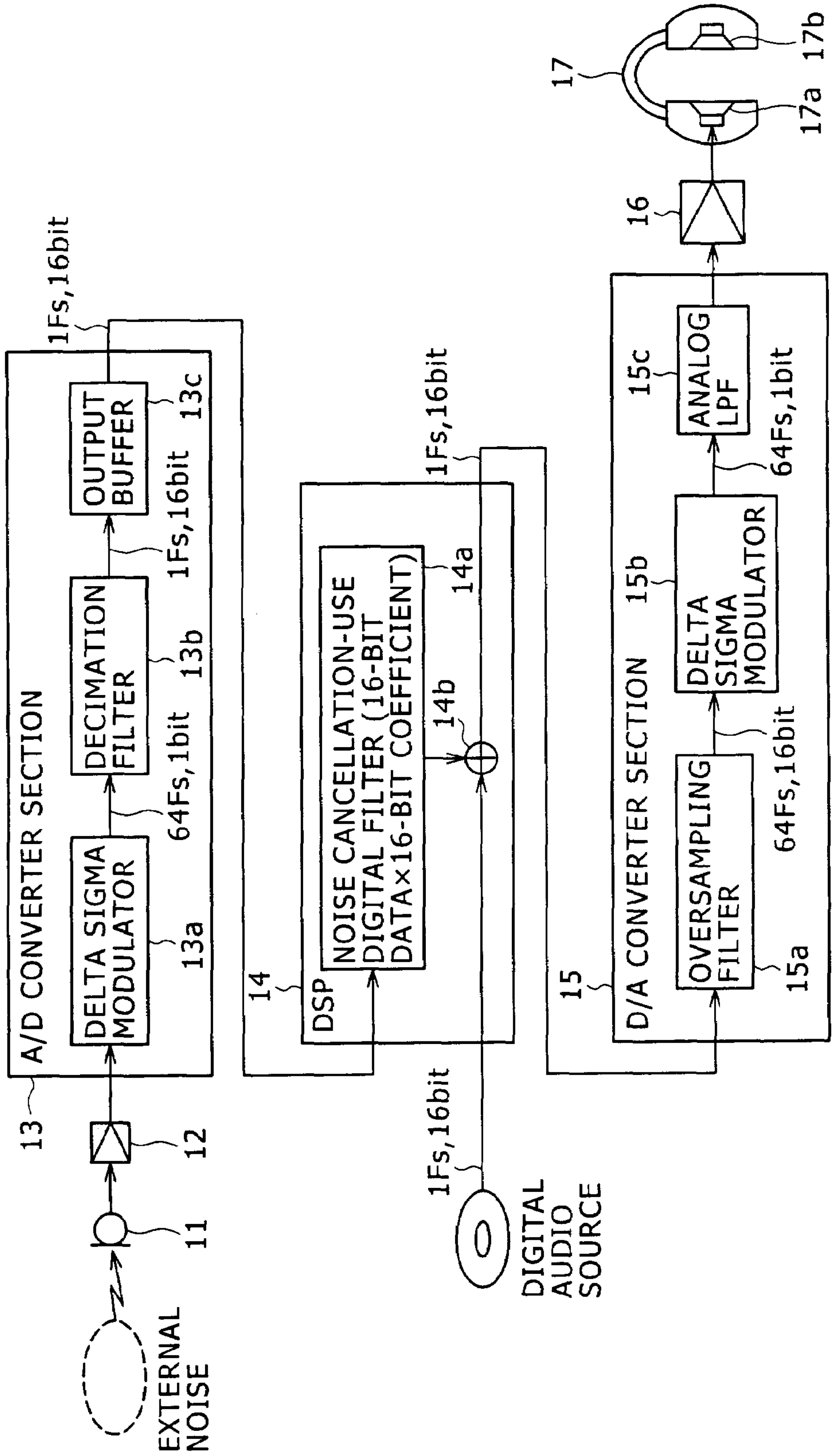
FIG. 1 is a block diagram illustrating an exemplary basic structure of a digital noise cancellation system in a headphone device.

FIG. 1 illustrates an exemplary structure of a noise cancellation system in a headphone device constructed using digital devices currently known.

The structure of the noise cancellation system illustrated in this figure is based on a feedforward system. In the feedforward system, an audio signal is obtained by picking up an external sound, and this audio signal is subjected to an appropriate filtering process to generate a cancellation-use audio signal. Then, this cancellation-use audio signal is combined with an audio signal of a necessary sound, and a resultant audio signal is outputted from a driver as a sound, with the intention to cancel the external sound to achieve noise cancellation.

The headphone device (hereinafter simply referred to as a "headphones") 17 illustrated in this figure is assumed to support dual-channel (L (left) and R (right)) stereo. A system structure as illustrated in this figure corresponds to one of an L channel and an R channel.

Note that a reference sampling frequency denoted as Fs (1 Fs) in the following descriptions is assumed to correspond to a sampling frequency of a digital audio source, a sound of which is a sound to be listened to using the headphone device 17. Specific examples of the digital audio source include a digital audio signal, with Fs=44.1 kHz and a quantization bit rate of 16 bits, recorded on a compact disc (CD).

In FIG. 1, a microphone 11 is used to pick up an external sound including an external sound (an external noise) that is caused around the headphones 17 and which is to be cancelled. Although not illustrated in this figure, in the case of the feedforward system, this microphone 11 is commonly provided on the exterior of a housing of the headphones 17 corresponding to each of the two (L and R) channels. In this figure, the microphone 11 provided for one of the two (L and R) channels is shown.

A signal obtained by the microphone 11 by picking up the external sound is amplified by an amplifier 12, and is inputted to an A/D converter section 13 in the form of an analog audio signal.

The A/D converter section 13 is formed as a single part (device), for example, and converts the input analog audio signal into a digital signal (a PCM signal) by quantizing the input analog audio signal with a sampling frequency of 1 Fs and a quantization bit rate of 16 bits ([1 Fs, 16 bit]) corresponding to those of the digital audio source described below. Then, the A/D converter section 13 outputs the obtained digital signal.

For this purpose, as illustrated in FIG. 1, the A/D converter section 13 includes a delta sigma (ΔΣ) modulator 13*a*, a decimation filter 13*b*, and an output buffer 13*c*.

The analog audio signal inputted to the A/D converter section 13 is first converted into a [64 Fs (=2.8224 MHz), 1 bit] digital signal by the delta sigma modulator 13*a*. This [64 Fs, 1 bit] digital signal passes through the decimation filter 13*b*, e.g., a finite impulse response (FIR) filter, to be converted into a [1 Fs, 16 bit] digital signal, and then is amplified by the output buffer 13*c*. A resultant signal outputted from the output buffer 13*c* is outputted from the A/D converter section 13.

The [1 Fs, 16 bit] digital signal outputted from the A/D converter section 13 is inputted to a digital signal processor (DSP) 14.

The DSP 14 is formed as a single chip part, for example, and performs a necessary digital signal process for generating at least an audio signal of a sound to be outputted from a driver 17*a* of the headphone device 17. As will be understood from the following descriptions, the audio signal to be outputted from the driver 17*a* of the headphone device 17 is composed of a combination of an audio signal of the digital audio source and the audio signal (i.e., the cancellation-use audio signal) for allowing the external sound picked up by the microphone 11 to be cancelled.

In FIG. 1, as a signal processing functional block contained in the DSP 14, a noise cancellation-use digital filter 14*a* is shown.

The digital signal outputted from the A/D converter section 13, i.e., the digital audio signal of the external sound picked up by the microphone 11, is inputted to the noise cancellation-use digital filter 14*a*. Then, this signal inputted is used to generate, as an audio signal of a sound to be outputted from the driver 17*a*, an audio signal (i.e., the cancellation-use audio signal) of a sound that will contribute to canceling the external sound that will arrive at an ear, corresponding to the driver 17*a*, of a user wearing the headphones. The cancellation-use audio signal in the simplest form is, for example, an audio signal that is in inverse relation to the audio signal inputted to the noise cancellation-use digital filter 14*a*, i.e., the audio signal obtained by picking up the external sound, in terms of characteristics and phase. In practice, additional characteristics are given to the cancellation-use audio signal, taking account of transfer characteristics of circuits, spaces, and so on in the noise cancellation system.

The noise cancellation-use digital filter 14*a* is formed, for example, as an FIR filter, and is configured to accept input of a signal with a quantization bit rate of 16 bits and multiply the signal by a 16-bit coefficient. Thus, a signal outputted from the noise cancellation-use digital filter 14*a* is in [1 Fs, 16 bit] form as is the signal inputted.

The signal of the digital audio source is also inputted to the DSP 14. This signal of the digital audio source is a digital audio signal in the [1 Fs, 16 bit] form, and is, in a combiner 14*b* within the DSP 14, combined with (added to) the cancellation-use audio signal, which is also in the [1 Fs, 16 bit] form, outputted from the noise cancellation-use digital filter 14*a*.

In such a manner, the digital audio signal composed of the combination of the signal of the digital audio source and the cancellation-use audio signal is obtained by the combiner 14*b*. This digital audio signal is outputted from the DSP 14 and inputted to a D/A converter section 15 in the subsequent stage.

The D/A converter section 15 is also formed as a single chip part, for example, and is used to convert a digital signal in the form resulting from conversion by the A/D converter section 13 described above into an analog signal. For example, as illustrated in FIG. 1, the D/A converter section 15 includes an oversampling filter 15*a*, a delta sigma modulator 15*b*, and an analog low-pass filter (LPF) 15*c*.

The [1 Fs, 16 bit] digital signal inputted to the D/A converter section 15 is subjected to an oversampling process by the oversampling filter 15*a* to be converted into a digital signal in [64 Fs, 16 bit] form. The resultant signal is outputted to the delta sigma modulator 15*b*.

The delta sigma modulator 15*b* converts the input digital signal into a 1-bit signal. In other words, the delta sigma modulator 15*b* converts the input digital signal into a digital signal in [64 Fs, 1 bit] form, and outputs the resulting signal. Then, the [64 Fs, 1 bit] digital signal outputted from the delta sigma modulator 15*b* passes through the analog LPF 15*c*, so that an analog audio signal is obtained as an output of the analog LPF 15*c*. That is, the [1 Fs, 16 bit] digital audio signal inputted to the D/A converter section 15 is converted into the analog audio signal, and this analog audio signal is outputted from the D/A converter section 15.

The analog audio signal outputted from the D/A converter section 15 is inputted to a power amplifier 16. The power amplifier 16 amplifies the input audio signal and outputs the amplified audio signal to drive the driver 17*a*, corresponding to one ear, of the headphones 17.

A sound outputted from the driver 17*a* driven in such a manner is composed of a combination of a sound component corresponding to the digital audio source and a sound component corresponding to the noise cancellation-use audio signal. In this sound, the sound component corresponding to the noise cancellation-use audio signal serves to cancel the external sound that comes from an outside to the ear corresponding to the driver 17*a*. As a result, in a sound heard by the ear, corresponding to the driver 17*a*, of the user wearing the headphones, the external sound is cancelled, ideally, so that the sound of the digital audio source is relatively emphasized.

In the structure as illustrated in FIG. 1, an A/D converter, a DSP, a D/A converter, and so on which are readily available for general (e.g., consumer) use are used. Therefore, this structure is a natural choice today when actually constructing a digital noise cancellation system for an audio source such as a CD, for example.

However, it is known that it is practically difficult to obtain a sufficient noise cancellation effect with the above structure. This is because actual devices that serve as the A/D converter section 13 and the D/A converter section 15 have a significantly long signal processing time, i.e., a significantly long input-output delay. Originally, these devices are devised to simply process an audio signal of an audio source, such as of a tune, and therefore the delay caused by signal processing has not produced a problem. However, when such devices are adopted in the noise cancellation system, the delay is too large to be neglected.

That is, with regard to the noise cancellation system as a whole constructed using such devices, a time (i.e., a response speed) between picking up of the external sound by the microphone 11 and the output of the sound from the driver involves a significant delay. Because of this delay, it is difficult to cancel the external sound with the sound component for noise cancellation outputted from the driver, for example. If the sampling frequency is 44.1 KHz and the delay corresponds to a time of 40 samples, even the A/D converter section 13 alone causes a phase delay of greater than 180° concerning a signal at a frequency greater than approximately 550 Hz, for example. When the delay is so large, the noise cancellation effect is hard to obtain, and also a phenomenon of the external sound being emphasized may arise.

As described above, in accordance with the structure of the digital noise cancellation system as illustrated in FIG. 1, a sufficient noise cancellation effect is obtained within a limited frequency range of approximately 550 Hz or lower. In the case where a standard range of 20 Hz to 20 kHz is set as an audible range, for example, the noise cancellation effect is obtained within a very narrow frequency range. That is, a practically sufficient noise cancellation effect is not obtained. This is why noise cancellation systems in headphone devices in practical use today are in analog form.

As noted previously, however, when there is a desire to provide various features such as the change or switch of the characteristics or the operation mode of the noise cancellation system or a desire for improved sound quality, the digital form is preferable to the analog form because the above desires are more easily fulfilled by the digital form. Thus, the digital noise cancellation system has great merit.

Hereinafter, a structure of a digital noise cancellation system in a headphone device in accordance with one embodiment of the present invention will be described. Despite its digital form, this digital noise cancellation system does not have the above-described delay problem and can be put to practical use.

Figure 2:
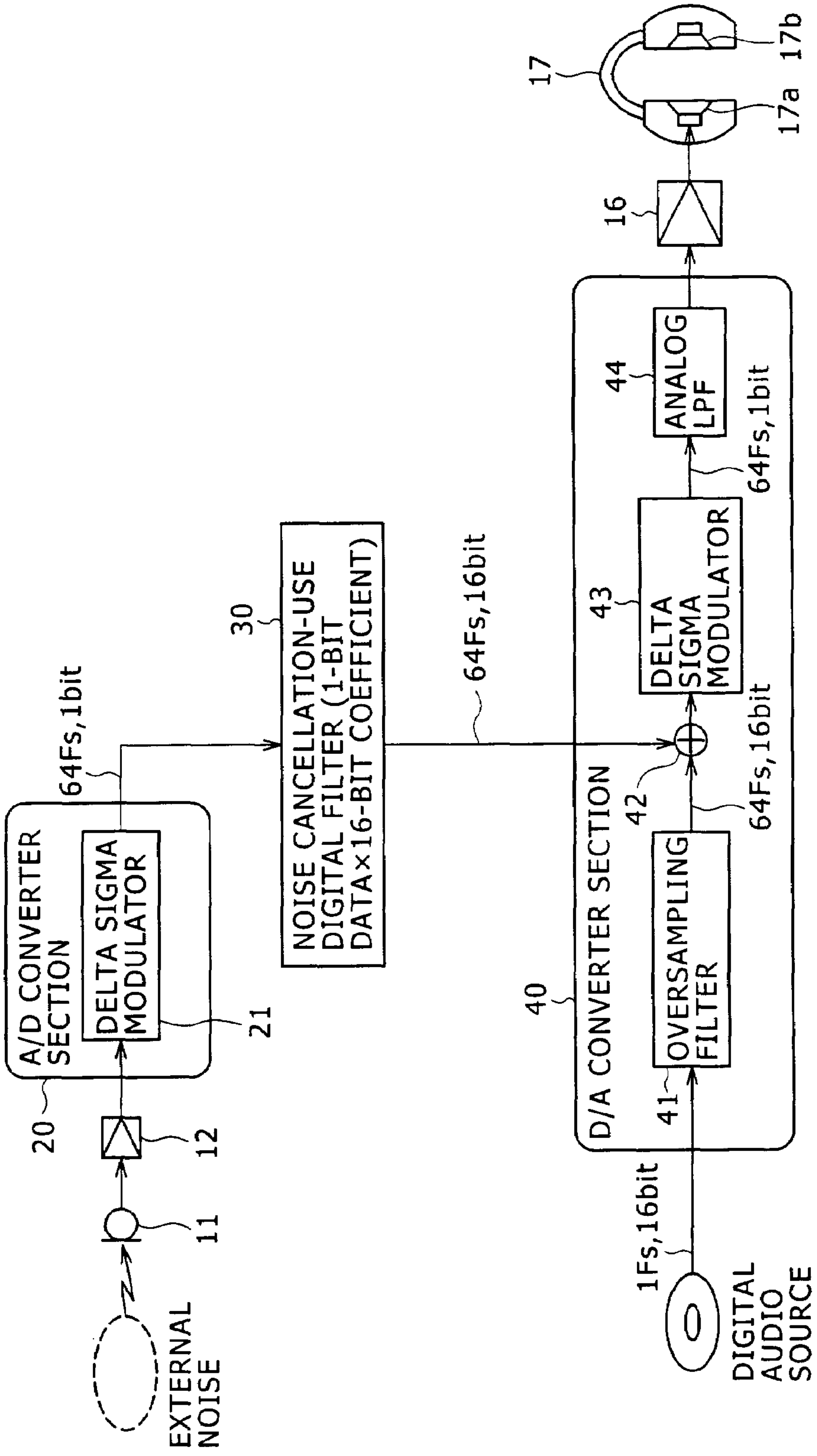
FIG. 2 is a block diagram illustrating an exemplary structure of a noise cancellation system in accordance with a first embodiment of the present invention.

FIG. 2 illustrates an exemplary structure of a noise cancellation system in a headphone device in accordance with a first embodiment of the present invention. Note that, in FIG. 2, components having their counterparts in FIG. 1 are assigned the same reference numerals as those of their counterparts in FIG. 1, and descriptions thereof will be omitted or simple descriptions thereof will be provided.

In the structure as illustrated in FIG. 2, instead of the A/D converter section 13 as shown in FIG. 1, an A/D converter section 20 is provided as a part for converting the analog audio signal of the external sound (i.e., the external noise) obtained by the microphone 11 and the amplifier 12 into a digital signal.

The A/D converter section 20 is formed as a single chip part, for example, and, as illustrated in FIG. 2, includes a delta sigma modulator 21. The input analog signal is converted by the delta sigma modulator 21 into a digital signal in [64 Fs (=2.8224 MHz), 1 bit] form. Then, the digital signal outputted from the delta sigma modulator 21 is outputted from the A/D converter section 20 and inputted to a noise cancellation-use digital filter 30 in the subsequent stage.

As with the noise cancellation-use digital filter 14*a* as shown in FIG. 1, the noise cancellation-use digital filter 30 has a function of generating a noise cancellation-use audio signal. That is, using the digital audio signal of the external sound supplied from the A/D converter section 20, the noise cancellation-use digital filter 30 generates an audio signal corresponding to a sound that has a characteristic for canceling the external sound that will arrive at the ear, corresponding to the driver 17*a*, of the user wearing the headphones.

Note that the digital audio signal inputted to the noise cancellation-use digital filter 14*a* as shown in FIG. 1 and the digital audio signal outputted from the noise cancellation-use digital filter 14*a* are both in the [1 Fs, 16 bit] form. On the other hand, the signal inputted to the noise cancellation-use digital filter 30 as shown in FIG. 2 is in the [64 Fs, 1 bit] form, while the signal outputted from the noise cancellation-use digital filter 30 is in the [64 Fs, 16 bit] form. The noise cancellation-use digital filter 30 can be formed by an FIR digital filter, for example, and accordingly, the signal outputted therefrom is in multi-bit form. In this embodiment, the quantization bit rate is set at 16 bits. The form of the signal outputted from the noise cancellation-use digital filter 30 is determined to be [64 Fs, 16 bit] in order that, as will be understood from the following description, the form of this signal may coincide with the form of the signal of the digital audio source, [64 Fs, 16 bit], with which this signal will be combined.

In this embodiment, instead of being contained in the DSP or the like, the noise cancellation-use digital filter 30 is an independent portion and formed as a single part, for example. The cancellation-use audio signal outputted from the noise cancellation-use digital filter 30 is inputted to a D/A converter section 40.

The D/A converter section 40 as shown in FIG. 2 is also formed as a single part, for example. Similar to the D/A converter section 15 as shown in FIG. 1, the D/A converter section 40 includes an oversampling filter 41, a delta sigma modulator 43, and an analog LPF 44. However, unlike the D/A converter section 15 as shown in FIG. 1, a combiner 42 is additionally provided between the oversampling filter 41 and the delta sigma modulator 43.

In this embodiment, as illustrated in FIG. 2, the signal of the digital audio source is inputted to the oversampling filter 41. Accordingly, the oversampling filter 41 converts an audio signal component corresponding to the digital audio source from the [1 Fs, 16 bit] form to the [64 Fs, 16 bit] form.

Then, the combiner 42 combines the audio signal of the digital audio source with the noise cancellation-use audio signal outputted from the noise cancellation-use digital filter 30, which are both in the [64 Fs, 16 bit] form, and outputs a resultant [64 Fs, 16 bit] digital signal to the delta sigma modulator 43.

The delta sigma modulator 43 accepts input of the [64 Fs, 16 bit] digital signal outputted from the combiner 42, converts this signal into a [64 Fs, 1 bit] digital signal, and outputs the resultant signal.

The digital signal outputted from the delta sigma modulator 43 passes through the analog LPF 44 to be converted into an analog audio signal, and this resultant analog audio signal is outputted from the D/A converter section 40.

The analog audio signal thus obtained is amplified by the power amplifier 16, and the driver 17*a* is driven by a resultant signal.

In accordance with this structure, the signal outputted from the combiner 42 is composed of a combination of the audio signal of the digital audio source and the noise cancellation-use audio signal, and therefore, a sound eventually outputted from the driver 17*a* is composed of a combination of a sound component for canceling the external sound and a reproduced sound of the digital audio source as in the case of FIG. 1. That is, the noise cancellation system in accordance with the feed-forward system is properly constructed.

Concerning the structure of FIG. 2, focus will now be placed on a noise processing system in which the external sound is picked up by the microphone 11 and the sound component for canceling the noise is outputted from the driver. Then, it can be said that the output from the delta sigma modulator 21 that forms an A/D conversion part (i.e., the A/D converter section 20) is inputted to the noise cancellation-use digital filter 30, while the output from the noise cancellation-use digital filter 30 is inputted to the delta sigma modulator 43 that forms a D/A conversion part (i.e., the D/A converter section 40).

Thus, compared to the structure of FIG. 1, the noise processing system in the structure of FIG. 2 does not include the decimation filter on the A/D conversion side or the oversampling filter on the D/A conversion side.

As noted previously, in the structure of FIG. 1, the delays in the A/D converter section 13 and the D/A converter section 15 are large. Regarding causes of these delays, a delay cased by the decimation filter 13*b* is dominant in the A/D converter section 13 and a delay caused by the oversampling filter 15*a* is dominant in the D/A converter section 15.

The present embodiment has been designed in view of this fact. That is, in order to exclude the influence of the delay caused by the decimation filter on the A/D conversion side and the delay caused by the oversampling filter on the D/A conversion side in the noise processing system, the input of the noise cancellation-use digital filter 30 is directly connected to the delta sigma modulator 21 (i.e., the A/D converter section 20) and the output of the noise cancellation-use digital filter 30 is directly connected to the delta sigma modulator 43 (within the D/A converter section 40).

In this manner, in the noise processing system, the dominant causes of the delays on both the D/A conversion side and the A/D conversion side are eliminated, so that the delay in the noise processing system is significantly reduced. Accordingly, the sound frequency range for which noise cancellation works effectively is significantly enlarged, and as a result, the practically sufficient noise cancellation effect is obtained. That is, the digital noise cancellation system in the headphone device that can be put to practical use is achieved.

Moreover, in the present embodiment, the noise cancellation-use digital filter 30 is so constructed as to reduce the delay to achieve a more excellent noise cancellation effect.

Exemplary structures of the noise cancellation-use digital filter 30 that causes the reduced delay will now be described below.

Figure 3A:
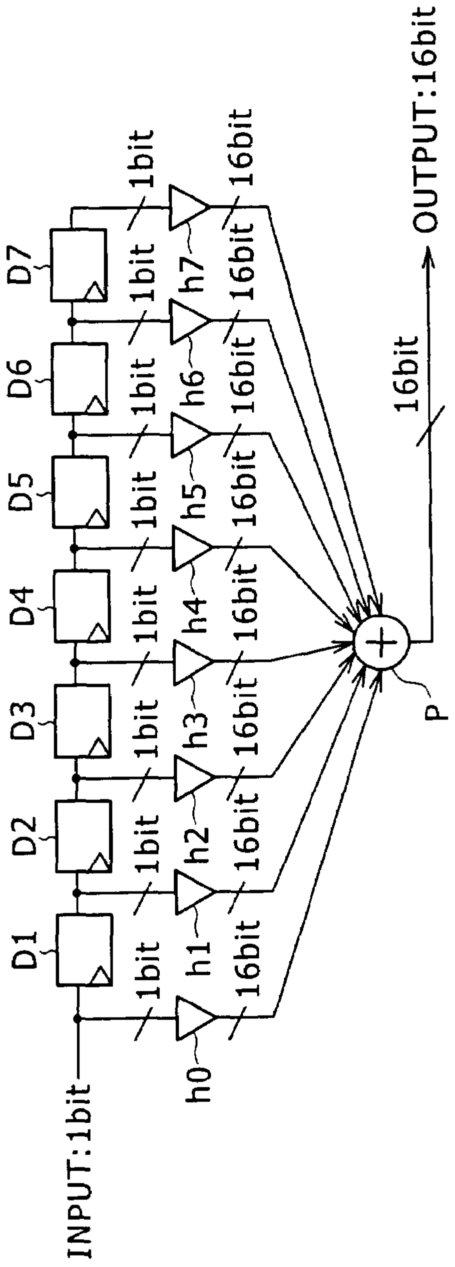
FIGS. 3A and 3B illustrate exemplary structures of a noise cancellation-use digital filter in accordance with one embodiment of the present invention.

First, in the case where an FIR digital filter (i.e., an FIR filter) is normally adopted as the noise cancellation-use digital filter 30, a structure as illustrated in FIG. 3A is adopted.

Specifically, referring to FIG. 3A, in the case where the noise cancellation-use digital filter 30 is formed as an 8-tap FIR filter, seven delay devices D1 to D7 are connected in series to form a shift register. In addition, coefficient multipliers h0 to h7 and an adder P are provided. The coefficient multipliers h0 to h7 receive outputs from the shift register, i.e., data inputted to the delay device D1 and data outputted from the delay devices D1 to D7, respectively, and multiply the received data by a predetermined coefficient. The adder P adds outputs from these coefficient multipliers h0 to h7 together. Since the digital signal inputted to the noise cancellation-use digital filter 30 is in the [64 Fs, 1 bit] form, the delay devices D1 to D7 and the coefficient multipliers h0 to h7 are configured to accept input of 1-bit signals. Since the digital signal outputted from the noise cancellation-use digital filter 30 should be in the [64 Fs, 16 bit] form, 16-bit coefficients are set in the coefficient multipliers h0 to h7 so that the outputs from the coefficient multipliers h0 to h7 will be 16-bit data, and these outputs are added together by the adder P.

Figure 8:
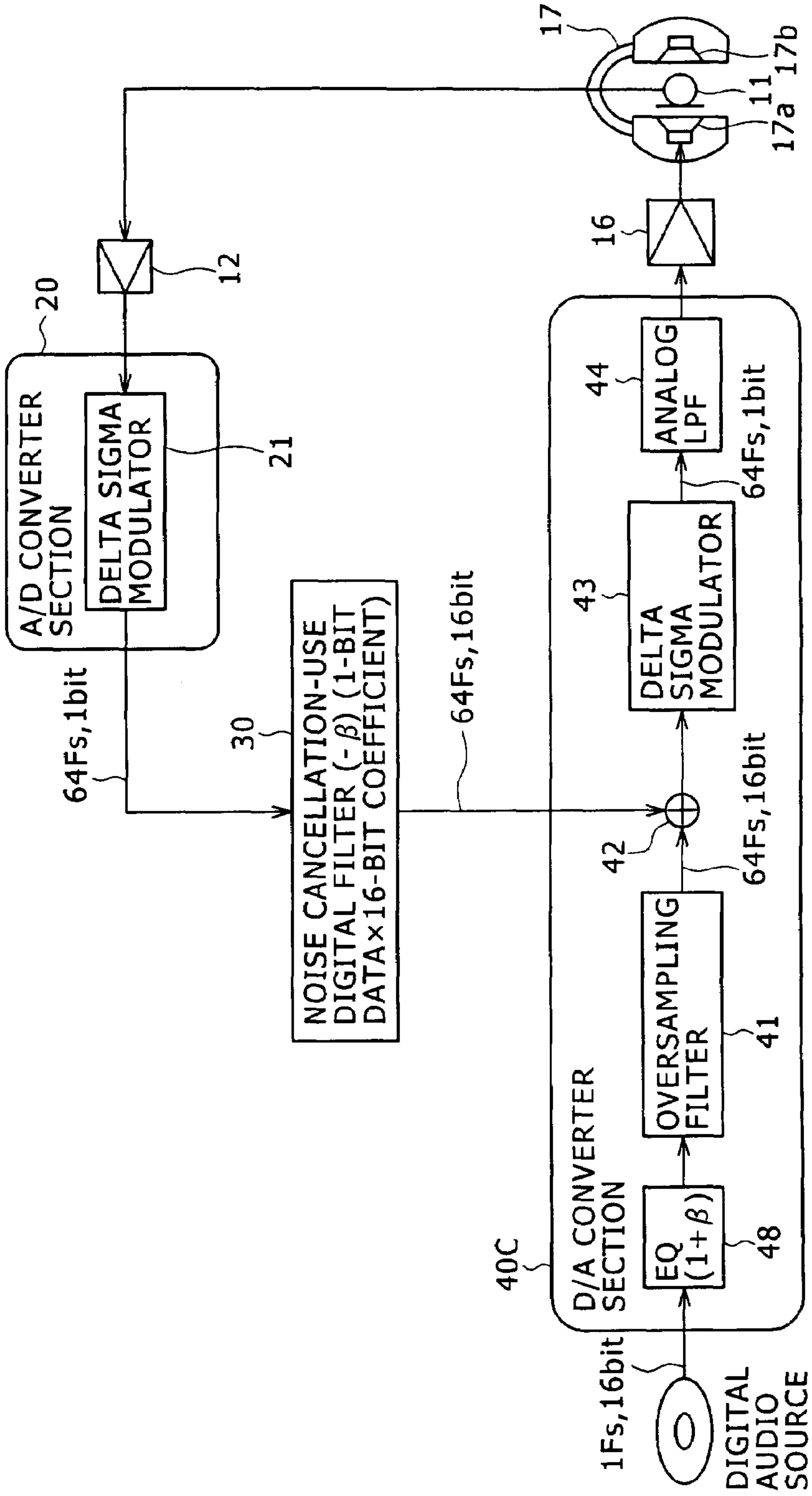
FIG. 8 is a block diagram illustrating an exemplary structure of a noise cancellation system in accordance with a sixth embodiment of the present invention.

It can be said that, in accordance with the structure as illustrated in FIG. 3A, 8-bit data, i.e., an arrangement of the data inputted to the delay device D1 and the data outputted from the delay devices D1 to D7, is converted into a 16-bit bit pattern that is linearly associated with a bit pattern of the 8-bit data, and the 16-bit bit pattern is outputted. Based on this fact, the noise cancellation-use digital filter 30 can also be constructed of the delay devices D1 to D7 and a ROM 60 as illustrated in FIG. 3B.

Figure 3B:
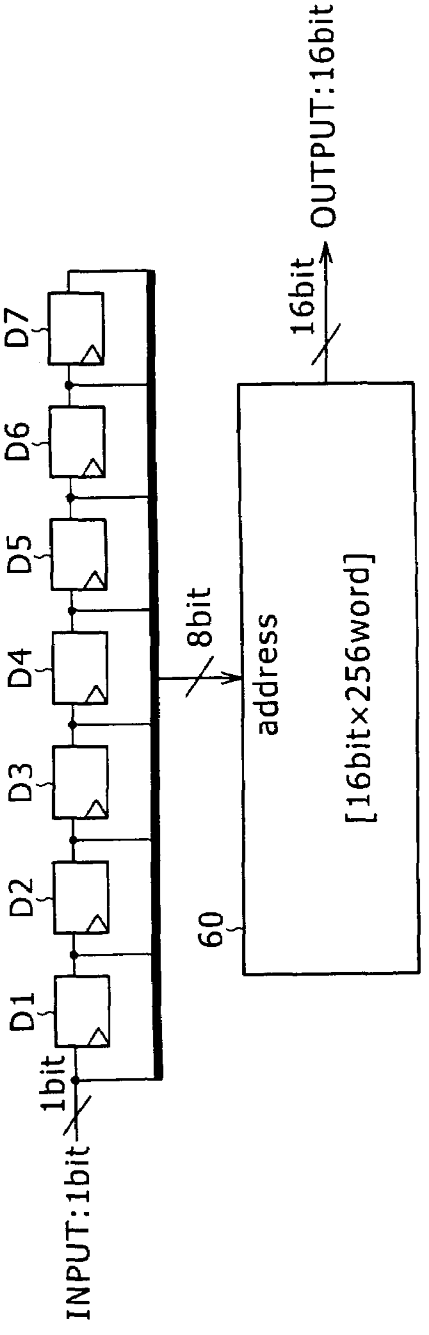

In FIG. 3B, 8-bit data is constructed of 1-bit data inputted to the delay device D1 and seven pieces of 1-bit data outputted from the delay devices D1 to D7, respectively, which can be considered as being outputted from the shift register at the same time, and this 8-bit data is used to specify an address in the ROM 60. Since there are 256 bit patterns that can be expressed by 8 bits, addresses 0 to 255 are set in the ROM 60. In the ROM 60, appropriate 16-bit bit patterns are stored so as to be associated with the addresses 0 to 255.

In accordance with the above structure, for each sample, one of the addresses 0 to 255 is specified for the ROM 60 and data of a 16-bit bit pattern corresponding to the specified address is read from the ROM 60. The 16-bit data thus read is outputted from the noise cancellation-use digital filter 30 in the present embodiment.

In accordance with the above structure, the coefficient multipliers h0 to h7 and the adder P as illustrated in FIG. 3A are omitted, and processes performed by the coefficient multipliers h0 to h7 and the adder P are realized by reading the data of the 16-bit bit pattern from the specified address in the ROM 60. Thus, circuitry is simplified.

The noise cancellation-use digital filter 30 that causes the reduced delay can also be realized by being formed as a minimum phase shift filter, for example. This can be realized by, with the structure as illustrated in FIG. 3A, for example, setting a pattern of the coefficients set in the coefficient multipliers h0 to h7 so as to form a minimum phase shift filter. Alternatively, the noise cancellation-use digital filter 30 may be formed by an infinite impulse response (IIR) digital filter. One characteristic of the IIR filter is that a delay amount is small as a result.

In the present embodiment, the sampling frequency of the signal outputted from the noise cancellation-use digital filter 30 is set as follows.

First, the D/A converter section 40 is configured to convert a digital audio signal as a PCM signal in the [1 Fs, 16 bit] form into an analog signal, and the oversampling filter converts the signal into the [64 Fs, 16 bit] form. That is, the sampling frequency of the signal obtained after oversampling is set at 64 Fs. Accordingly, the delta sigma modulator 43, which follows the oversampling filter, is configured to convert the signal in the [64 Fs, 16 bit] form into a 1-bit signal. Thus, the output from the delta sigma modulator 43 is in the [64 Fs, 1 bit] form.

Moreover, in the present embodiment, the noise cancellation-use audio signal outputted from the noise cancellation-use digital filter 30 is directly inputted to the delta sigma modulator 43 in the D/A converter section 40, without passing through the oversampling filter. This is why the noise cancellation-use audio signal should be in a [sampling frequency, quantization bit rate] form corresponding to that of the signal inputted to the delta sigma modulator 43 (and outputted from the oversampling filter). Thus, the cancellation-use audio signal outputted from the noise cancellation-use digital filter 30 as illustrated in FIG. 2 is in the [64 Fs, 16 bit] form. Regarding the sampling frequency, the noise cancellation-use audio signal outputted from the noise cancellation-use digital filter 30 should have the same sampling frequency as the signal outputted from the delta sigma modulator 43.

In the present embodiment, the sampling frequency after oversampling, i.e., the sampling frequency of the signal (i.e., the noise cancellation-use audio signal) outputted from the noise cancellation-use digital filter 30, is assumed to be 64 Fs. However, the present invention is not limited to this. This sampling frequency should be greater than the sampling frequency, 1 Fs, of the PCM signal of the digital audio source, but as long as it is, any frequency value that allows the reproduced sound to have a sufficient quality, for example, may be set as the above sampling frequency. More specifically, on the assumption that the sampling frequency of the PCM signal of the digital audio source is 1 Fs, the sampling frequency of the noise cancellation-use audio signal (i.e., the sampling frequency after oversampling) is set at $2^n$ Fs where n is a natural number greater than 0, for example. In practice, it is desirable that this sampling frequency be set at 4 Fs or higher.

Next, an exemplary structure of a noise cancellation system in accordance with a second embodiment of the present invention will now be described below with reference to FIG. 4. Note that, in FIG. 4, components having their counterparts in FIG. 2 are assigned the same reference numerals as those of their counterparts in FIG. 2, and descriptions thereof will be omitted.

First, a basic structure of the second embodiment will now be described below.

Figure 4:
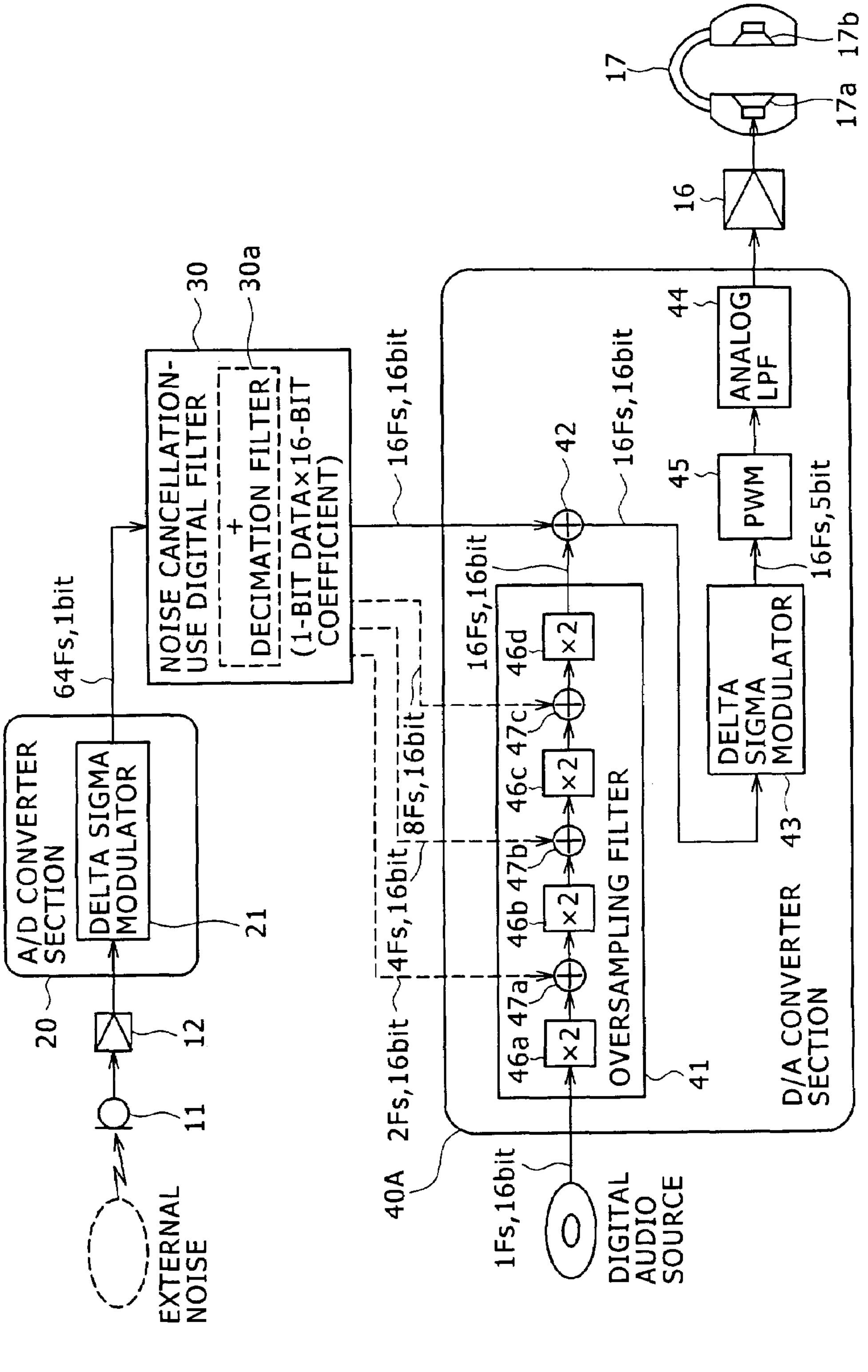
FIG. 4 is a block diagram illustrates an exemplary structure of a noise cancellation system in accordance with a second embodiment of the present invention.

In FIG. 4, broadly speaking, a D/A converter section 40A includes the oversampling filter 41, the combiner 42, the delta sigma modulator 43, a pulse width modulation (PWM) modulator 45, and the analog LPF 44. That is, compared to the D/A converter section 40 as illustrated in FIG. 2, the PWM modulator 45 is additionally inserted between the delta sigma modulator 43 and the analog LPF 44.

Moreover, the oversampling filter 41 in the D/A converter section 40A is configured to accept input of a [1 Fs, 16 bit] signal of the digital audio source and convert this signal into [16 Fs, 16 bit] form.

Thus, the combiner 42 in the D/A converter section 40A combines a [16 Fs, 16 bit] digital signal with another [16 Fs, 16 bit] digital signal. That is, a noise cancellation-use audio signal outputted from a noise cancellation-use digital filter 30 should be not in the [64 Fs, 16 bit] form as in FIG. 2 but in the [16 Fs, 16 bit] form.

Thus, in this embodiment, the noise cancellation-use digital filter 30 is configured to give the input signal a characteristic as a noise cancellation-use audio signal, and perform a decimation process so that the input signal with a sampling frequency of 64 Fs will be outputted with a sampling frequency of 16 Fs. In other words, the noise cancellation-use digital filter 30 is configured to have a function as a noise cancellation-use filter and an additional function as a decimation filter 30*a*. While some structures are conceivable for fulfilling both the functions, one of the most efficient structures is to cause the noise cancellation-use digital filter to function as the decimation filter as well, taking advantage of the fact that the noise cancellation-use digital filter has a characteristic of an LPF. The decimation filter also has the characteristic of the LPF.

The combiner 42 combines the signal of the digital audio source, which has been subjected to oversampling by the oversampling filter 41 to have the [16 Fs, 16 bit] form, with the [16 Fs, 16 bit] noise cancellation-use audio signal outputted from the noise cancellation-use digital filter 30, and a resultant signal is inputted to the delta sigma modulator 43.

In this embodiment, the delta sigma modulator 43 converts the input signal into a [16 Fs, 5 bit] signal with a quantization bit rate of 5 bits instead of 1 bit. This [16 Fs, 5 bit] signal is inputted to the PWM modulator 45 and subjected to PWM modulation therein, and is allowed to pass through the analog LPF 44 to be converted into an analog audio signal, which is outputted from the D/A converter section 40A. That is, a D/A conversion part of the second embodiment has a structure in accordance with a structure of a class-D amplifier.

Variants of the second embodiment are conceivable as follows.

For example, referring to FIG. 4, the oversampling filter 41 may be configured to include multiple upsampling circuits 46*a* to 46*d* connected in series. In this example, each of the upsampling circuits 46*a* to 46*d* is configured to double the sampling frequency, and since four such upsampling circuits are connected in series, the input signal in the [1 Fs, 16 bit] form is converted into the [16 (=2×2×2×2) Fs, 16 bit] form and thus outputted from the oversampling filter 41.

Moreover, the noise cancellation-use digital filter 30 is configured to convert the input signal with a sampling frequency of 64 Fs into a 16-bit signal with a sampling frequency lower than 16 Fs, such as 8 Fs, 4 Fs, or 2 Fs, by means of the decimation filter 30*a*, and the resultant signal is outputted from the noise cancellation-use digital filter 30. This signal is inputted to an appropriate one of the upsampling circuits in the oversampling filter 41 in accordance with the sampling frequency of this signal.

In the case where the signal outputted from the noise cancellation-use digital filter 30 is in [8 Fs, 16 bit] form, for example, a combiner 47*c* is provided in front of the upsampling circuit 46*d* in the oversampling filter 41, and the combiner 47*c* combines the signal outputted from the noise cancellation-use digital filter 30 with the signal outputted from the upsampling circuit 46*c* to output a resultant signal to the upsampling circuit 46*d*. In accordance with this structure, the combiner 47*c* combines the signal of the digital audio source as upsampled to [8 Fs, 16 bit] with the signal, which is also in the [8 Fs, 16 bit] form, outputted from the noise cancellation-use digital filter 30. Then, the resultant signal passes through the upsampling circuit 46*d* to finally become an [16 Fs, 16 bit] audio signal, which is inputted to the delta sigma modulator 43 (in this case, the combiner 42 can be omitted).

Similarly, in the case where the signal outputted from the noise cancellation-use digital filter 30 is in [4 Fs, 16 bit] form, a combiner 47*b* is provided in front of the upsampling circuit 46*c* in the oversampling filter 41, and the combiner 47*b* combines the signal outputted from the noise cancellation-use digital filter 30 with the signal outputted from the upsampling circuit 46*b* to output a resultant signal to the upsampling circuit 46*c*.

In the case where the signal outputted from the noise cancellation-use digital filter 30 is in [2 Fs, 16 bit] form, a combiner 47*a* is provided in front of the upsampling circuit 46*b* in the oversampling filter 41, and the combiner 47*a* combines the signal outputted from the noise cancellation-use digital filter 30 with the signal outputted from the upsampling circuit 46*a* to output a resultant signal to the upsampling circuit 46*b*.

In the above variants, the number of operation steps per sampling period is increased, for example, and therefore, in the case where a necessary amount of operation in one sampling period in the noise cancellation-use digital filter 30 has been increased, a desired filter characteristic can be achieved without the need to increase a clock frequency of the system.

Note that it has been noted concerning the first embodiment that the sampling frequency of the noise cancellation-use audio signal outputted from the noise cancellation-use digital filter 30 should be the same as the sampling frequency of the signal handled by the delta sigma modulator 43 in the D/A converter section 40. In the above-described variants, however, the sampling frequency of the noise cancellation-use audio signal is lower than the sampling frequency of the signal handled by the delta sigma modulator 43. If the upsampling circuit(s) within the oversampling filter 41 through which the noise cancellation-use audio signal passes is regarded as a component of the noise cancellation-use digital filter, however, it can be said that the sampling frequency of the noise cancellation-use audio signal is the same as the sampling frequency of the signal handled by the delta sigma modulator 43 in the D/A converter section 40A.

In the structures of the above variants, the noise cancellation-use audio signal passes through a part of the oversampling filter 41, resulting in an additional delay compared to when the noise cancellation-use audio signal does not pass through the oversampling filter 41 at all, for example. However, compared to the structure of FIG. 1, in which the noise cancellation-use audio signal passes throughout the oversampling filter 15*a*, the effect of reduced delay in the D/A converter section is achieved.

Next, an exemplary structure of a third embodiment of the present invention will now be described below with reference to FIG. 5. Note that, in FIG. 5, components that have their counterparts in FIGS. 2 and 4 are assigned the same reference numerals as those of their counterparts, and descriptions thereof will be omitted.

Figure 5:
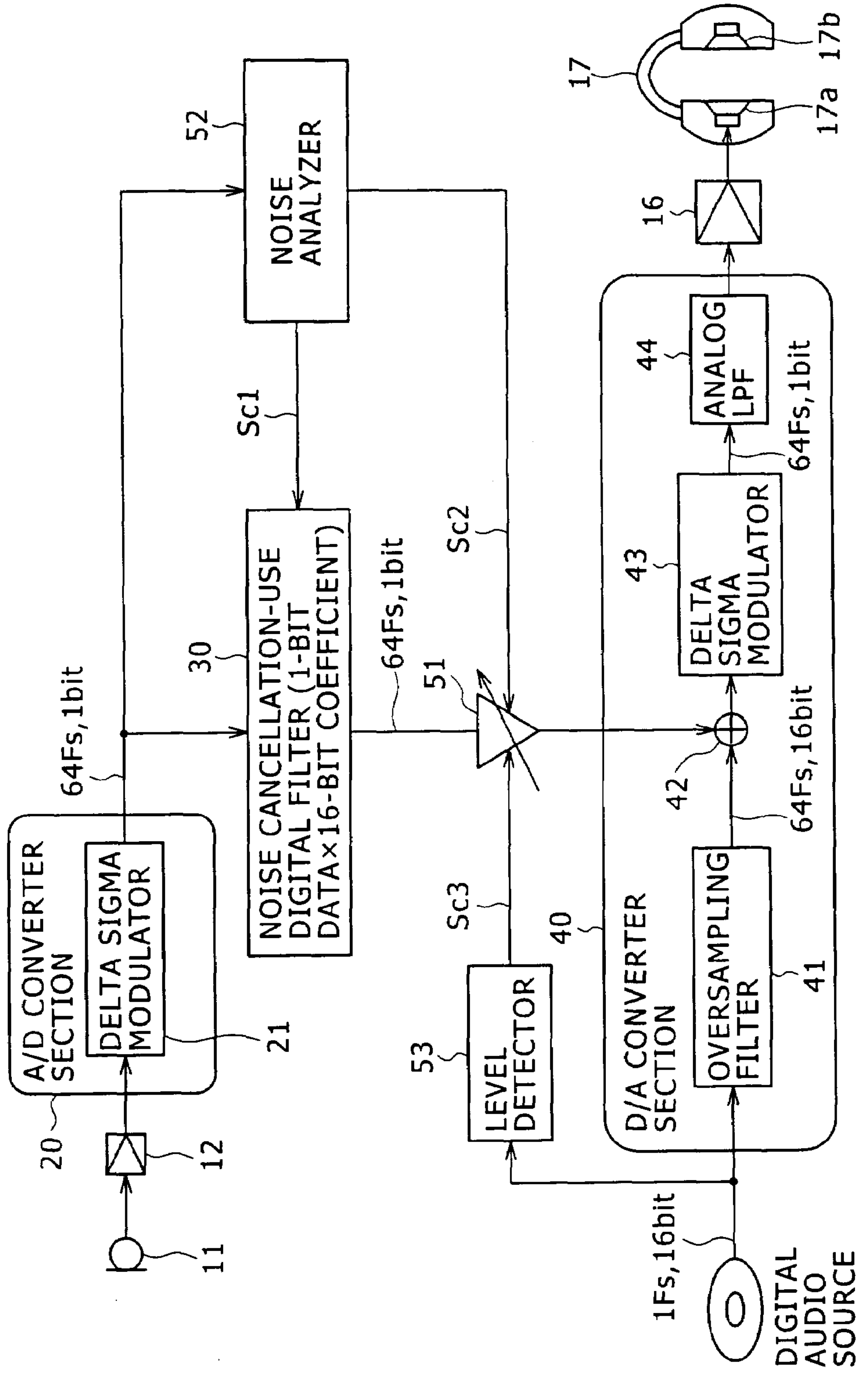
FIG. 5 is a block diagram illustrating an exemplary structure of a noise cancellation system in accordance with a third embodiment of the present invention.

Compared to the structure of the first embodiment as illustrated in FIG. 2, a noise cancellation system as illustrated in FIG. 5 additionally includes a level adjuster 51, a noise analyzer 52, and a level detector 53. With this structure, a noise cancellation operation is performed in accordance with contents of the external sound and the signal of the digital audio source, and so on as described below.

The level adjuster 51 is inserted between the output of the noise cancellation-use digital filter 30 and the input of the combiner 42. That is, the level adjuster 51 accepts input of the audio signal outputted from the noise cancellation-use digital filter 30, adjusts a level of the audio signal, and outputs the level-adjusted audio signal to the combiner 42.

The digital audio signal of the external sound outputted from the A/D converter section 20 is inputted to both the noise cancellation-use digital filter 30 and the noise analyzer 52. The noise analyzer 52 performs an analysis process on the digital audio signal concerning a tone color, a tone quality, a level, and so on of the external sound as noise. Based on a result of this analysis, the noise analyzer 52 determines an optimum coefficient in the noise cancellation-use digital filter 30 and an optimum level of the noise cancellation-use audio signal, and, based on a result of this determination, outputs a coefficient control signal Sc1 to the noise cancellation-use digital filter 30 to instruct the noise cancellation-use digital filter 30 to set the determined coefficient, and outputs a signal level control signal Sc2 for specifying the determined level of the noise cancellation-use audio signal to the level adjuster 51.

Meanwhile, the signal of the digital audio source is inputted to both the D/A converter section 40 and the level detector 53, and the level detector 53 detects a level of the input signal. As to a technique for detecting the level, the level detector 53 may detect absolute values of the audio signal and determine an envelope obtained by the absolute values of the detected levels to be a detected level, for example. Then, based on a result of this detection, the level detector 53 determines an optimum level of the noise cancellation-use audio signal so that sound of the signal of the digital audio source will be heard excellently, and outputs a signal level control signal Sc3 for specifying the determined level to the level adjuster 51. Note that the level of the noise cancellation-use audio signal thus determined has a value that will not cause data overflow when the noise cancellation-use audio signal is combined with the signal of the digital audio source.

In accordance with the control signals thus outputted, the noise cancellation-use digital filter 30 changes the coefficient, and the level adjuster 51 adjusts the level of the noise cancellation-use audio signal outputted from the noise cancellation-use digital filter 30. As a result, in accordance with variation in the condition of the external sound and variation in the level of the signal of the digital audio source, the optimum coefficient of the noise cancellation-use digital filter 30 and the optimum level of the noise cancellation-use audio signal are set, so that a nearly optimum noise cancellation effect is obtained at all times.

Note that the level detector 53 may alternatively accept input of the signal outputted from the oversampling filter 41 and detect a level of this signal.

Figure 6:
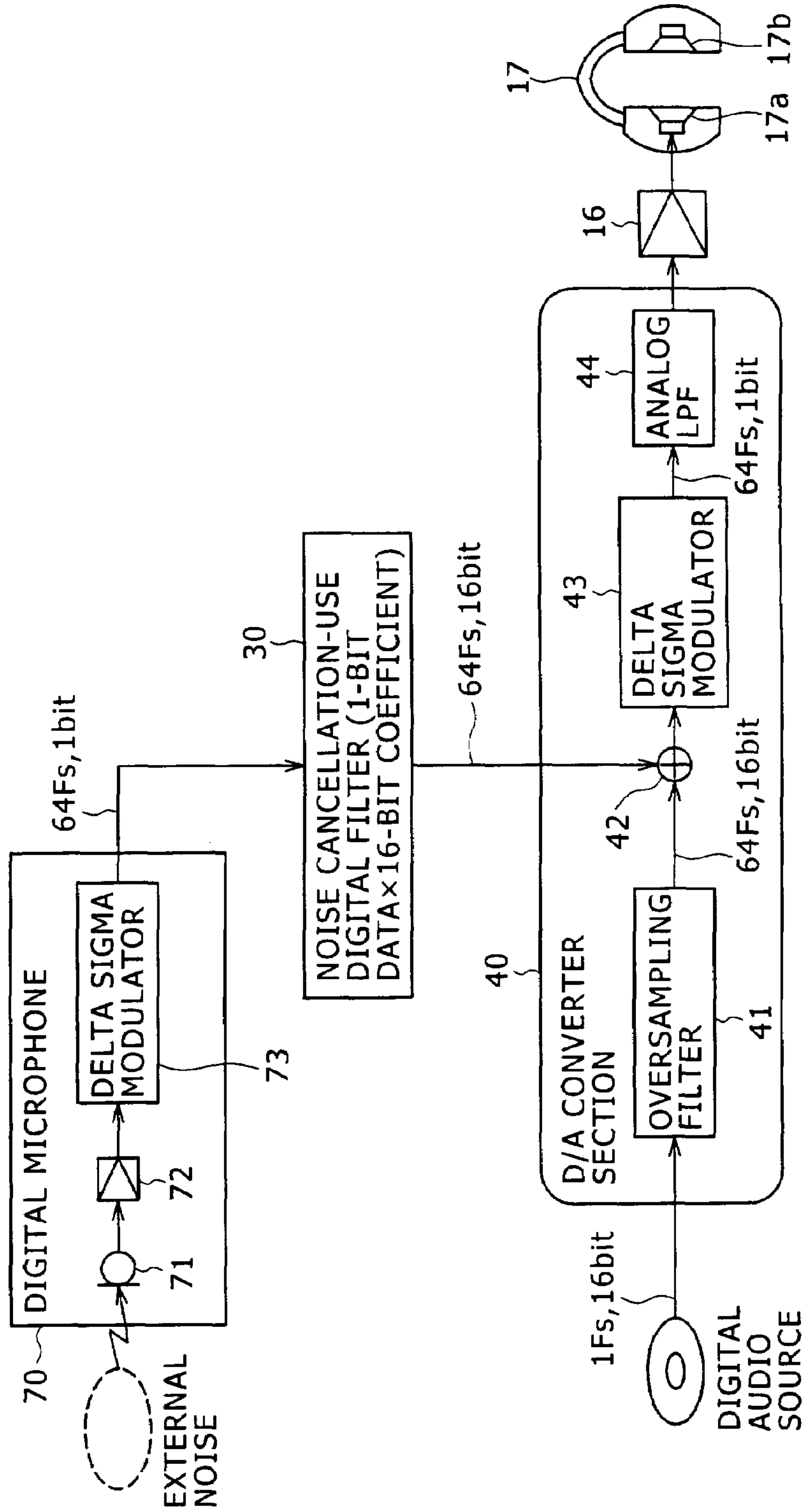
FIG. 6 is a block diagram illustrating an exemplary structure of a noise cancellation system in accordance with a fourth embodiment of the present invention.

FIG. 6 illustrates an exemplary structure of a fourth embodiment of the present invention. Note that, in FIG. 6, components that have their counterparts in FIGS. 2, 4, and 5 are assigned the same reference numerals as those of their counterparts, and descriptions thereof will be omitted.

In the fourth embodiment, a digital microphone 70 is adopted as a part for picking up the external sound and converting the external sound into a digital audio signal.

The digital microphone 70 is formed as a single part, for example. As illustrated in FIG. 6, the digital microphone 70 includes a microphone 71, an amplifier 72, and a delta sigma modulator 73. In functional terms, the microphone 71 and the amplifier 72 are equivalent to the microphone 11 and the amplifier 12 as illustrated in FIG. 2, for example, and are used to obtain an analog audio signal of the external sound. The analog audio signal thus obtained is inputted to the delta sigma modulator 73 and converted therein into a [64 Fs, 1 bit] digital signal, and this signal is outputted from the digital microphone 70. This signal outputted from the digital microphone 70 is inputted to the noise cancellation-use digital filter 30. Physically, the digital microphone 70 as described above is provided on the housing of the headphone device 17 such that the microphone 71 is capable of picking up the external sound.

Figure 7:
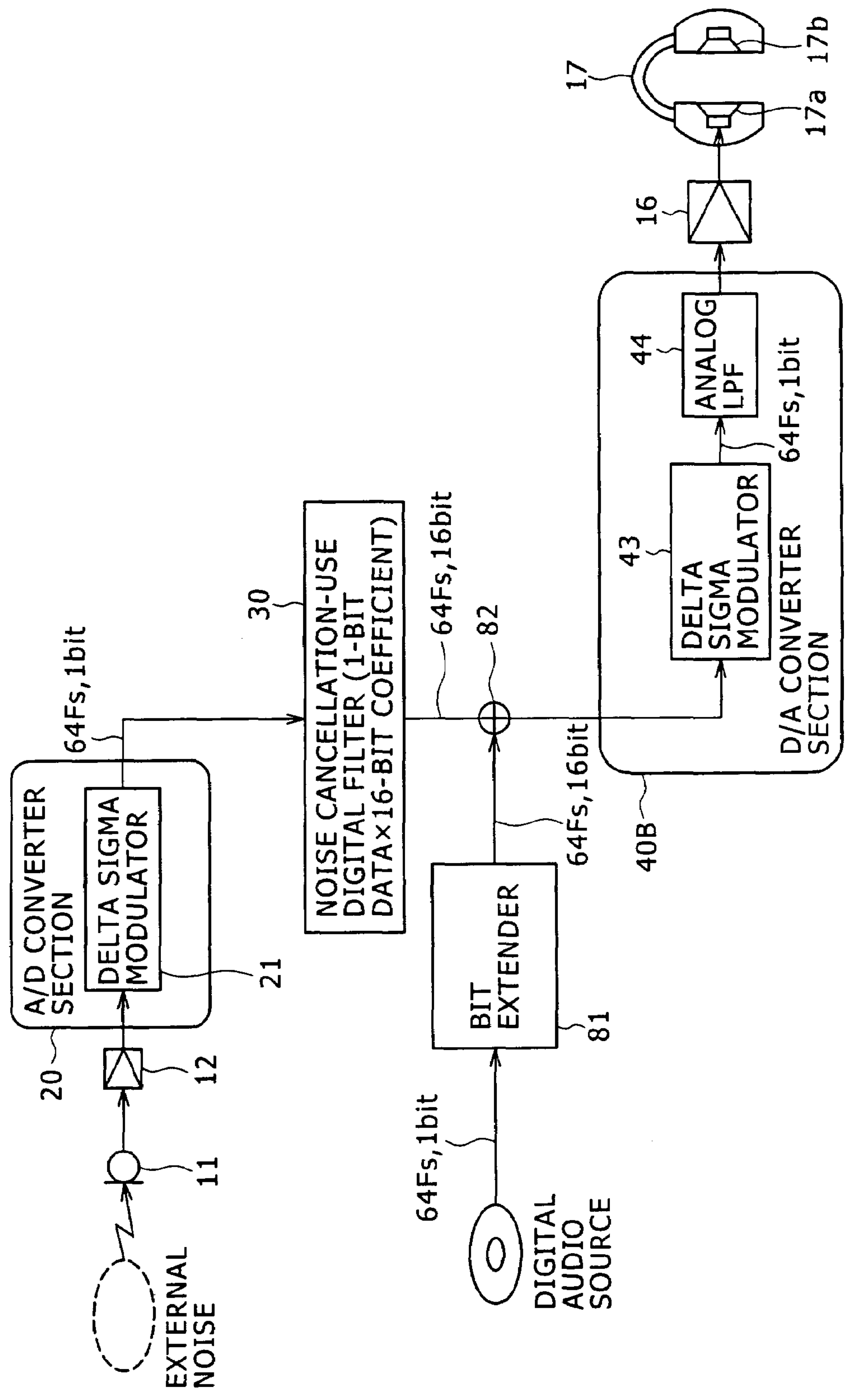
FIG. 7 is a block diagram illustrating an exemplary structure of a noise cancellation system in accordance with a fifth embodiment of the present invention.

FIG. 7 illustrates an exemplary structure of a fifth embodiment of the present invention. Note that, in FIG. 7, components that have their counterparts in FIGS. 2, 4, 5, and 6 are assigned the same reference numerals as those of their counterparts, and descriptions thereof will be omitted.

It has been assumed in the above-described embodiments that the digital audio source is the CD or the like which provides the PCM digital audio signal in the [1 Fs, 16 bit] form. The [1 Fs, 16 bit] form of the digital audio signal is one predominant form today, but besides, signals in a so-called direct stream digital (DSD) format, such as digital audio signals in the [64 Fs, 1 bit] form recorded on a Super Audio CD (SACD) or the like, which correspond to a signal after delta-sigma modulation, have come to be handled as substance of audio content. The structure in accordance with the fifth embodiment corresponds to the case where the digital audio source provides such a signal in the DSD format.

The digital audio source as illustrated in FIG. 7 provides a signal in a [64 Fs, 1 bit] DSD format. A bit extender 81 is provided so that this signal can be combined by a combiner 82 with a [64 Fs, 16 bit] noise cancellation-use audio signal outputted from the noise cancellation-use digital filter 30. The bit extender 81 accepts input of the [64 Fs, 1 bit] signal from the digital audio source, performs a bit extension process for extending the quantization bit rate to 16 bits, thereby converting the signal into a [64 Fs, 16 bit] signal, and outputs the resultant signal to the combiner 82.

Note that the above bit extension process performed by the bit extender 81 refers to a process of converting a 1-bit signal in the DSD format, for example, i.e., a signal that can take two values, 1 and 0, into a 16-bit signal, 0x0400 (0.5) or 0xC000 (−0.5). Therefore, the bit extender 81 can be formed by a digital filter having the characteristic of the LPF, and further, the bit extender 81 may have the structure as illustrated in FIG. 3B, which uses the ROM.

A signal resulting from the combining of the above two signals by the combiner 82 is inputted to a D/A converter section 40B. Compared to the D/A converter section 40 as illustrated in FIG. 2, for example, the D/A converter section 40B does not include the oversampling filter. The combiner 82 as illustrated in FIG. 7 corresponds to the combiner 42 within the D/A converter section 40 in FIG. 2, but in this embodiment, the combiner 82 is an independent part and is not contained in the D/A converter section 40B.

The audio signal which is composed of the combination of the signal of the digital audio source and the cancellation-use audio signal and outputted from the combiner 82 passes through the delta sigma modulator 43 and the LPF within the D/A converter section 40B to be converted into an analog signal, and this analog signal is outputted to the power amplifier 16.

FIG. 8 illustrates an exemplary structure of a sixth embodiment of the present invention. Note that, in FIG. 8, components having their counterparts in FIGS. 2, 4, 5, 6, and 7 are assigned the same reference numerals as those of their counterparts, and descriptions thereof will be omitted.

Noise cancellation systems in headphone devices are broadly classified into the feedforward system and the feedback system. The first to fifth embodiments described above are based on the feedforward system. However, the present invention is also applicable to the feedback system, instead of the feedforward system. As such, the exemplary structure in accordance with the sixth embodiment is based on the feedback system.

As schematically shown in FIG. 8, in the case of the feedback system, the microphone 11 is so provided as to pick up a sound outputted from the driver 17*a* near the ear of the user wearing the headphones. A sound picked up in this case contains the sound outputted from the driver and an external sound component that has intruded into the housing of the headphone device and is arriving at the ear of the user wearing the headphone device, for example. A signal of the sound thus picked up is amplified by the amplifier 12 to become an analog audio signal, and this analog audio signal is converted into a [64 Fs, 1 bit] digital audio signal by the delta sigma modulator 21 within the A/D converter section 20, and the resultant digital audio signal is inputted to the noise cancellation-use digital filter 30.

The noise cancellation-use digital filter 30 gives a necessary characteristic to the input signal, for example, to generate, as the noise cancellation-use audio signal, an audio signal of a sound having a characteristic for canceling the external sound that will arrive at the ear, corresponding to the driver 17*a*, of the user wearing the headphones. This process is generally a process of giving a transfer function $-\beta$ for noise cancellation to the signal of the sound picked up. Then, the noise cancellation-use audio signal generated is inputted to the combiner 42 provided at the back of the oversampling filter 41 within a D/A converter section 40C.

Compared to the D/A converter section 40 as illustrated in FIG. 2, the D/A converter section 40C additionally includes an equalizer 48, which is provided in front of the oversampling filter 41. The equalizer 48 gives a characteristic based on a transfer function $1+\beta$ to the signal of the digital audio source. In the case of the feedback system, the noise cancellation-use audio signal outputted from the noise cancellation-use digital filter 30 contains a component corresponding to the external sound and also a component corresponding to the sound of the digital audio source outputted from the driver 17*a* and picked up by the microphone 11. That is, a characteristic corresponding to a transfer function $1/1+\beta$ is given to the component of the sound of the digital audio source. Accordingly, the equalizer 48 is configured to give the characteristic based on the transfer function $1+\beta$, which is the inverse of $1/1+\beta$, to the signal of the digital audio source in advance. Thus, when the signal outputted from the oversampling filter 41 is combined with the noise cancellation-use audio signal by the combiner 42, the above transfer characteristic $1/1+\beta$ is cancelled. Thus, a signal outputted from the combiner 42 is composed of a combination of a signal component having a characteristic for canceling the external sound and a signal component corresponding to the original signal of the digital audio source. Then, the signal outputted from the combiner 42 passes through the delta sigma modulator 43 and the analog LPF 44 to be converted into an analog audio signal, and this analog audio signal is amplified by the power amplifier 16, and the driver 17*a* is driven by a resulting signal to output a corresponding sound.

As described above, in the case of the feedback system, the sound outputted from the driver and the external sound component that has intruded into the housing of the headphones are picked up near the ear of the user wearing the headphones to generate the signal used for noise cancellation. Then, this signal used for noise cancellation is outputted from the driver so as to involve negative feedback. As a result, a sound that contributes to canceling the external sound to relatively emphasize the sound of the digital audio source will reach the ear, corresponding to the driver 17*a*, of the user wearing the headphone device.

Note that, in the above-described embodiments, the A/D converter section, the noise cancellation-use digital filter, the D/A converter section, and so on are independent parts, and the combination of these parts forms the noise cancellation system. However, all or some of these parts may be integrated into a single part, for example.

It is assumed in the above-described embodiments that the sound that is originally to be heard is the sound of the digital audio source, i.e., a digitized audio signal in a certain form. Specifically, as noted previously, it is assumed in the above-described embodiments that the sound that is originally to be heard is the sound of the digital audio signal recorded on the CD, the SACD, or the like, for example. It is needless to say, however, that the sound that is originally to be heard may initially be in the form of an analog audio signal. In this case, this analog audio signal is converted into a digital signal via A/D conversion, and this digital signal is inputted to the D/A converter section 40 (40B, 40C) as the signal of the digital audio source in the above-described embodiments, for example.

Note that the sampling frequency and the quantization bit rate handled by each of the digital signal processing blocks in the noise cancellation system are not necessarily identical between the above-described embodiments. As will be understood from this fact, as long as the noise cancellation system can be formed properly, the sampling frequency and the quantization bit rate handled by each of the digital signal processing blocks in the noise cancellation system may be changed as necessary.

Also note that, in the above-described embodiments, the noise cancellation system is based on either the feedforward system or the feedback system. However, the structures in accordance with the above-described embodiments can also be applied to a noise cancellation system in accordance with a combination of the feedforward system and the feedback system. Such a noise cancellation system can be achieved, for example, by adding, to the structure as illustrated in FIG. 8, a noise cancellation-use signal processing system in accordance with the feedforward system as composed of the microphone 11, the amplifier 12, the A/D converter section 20, and the noise cancellation-use digital filter 30 as illustrated in FIG. 2, for example. In this case, the signal outputted from the noise cancellation-use digital filter 30 corresponding to the feedforward system is additionally combined with the signal of the digital audio source by the combiner 42 as illustrated in FIG. 8.

No specific mention has been made about how the parts for signal processing that form the noise cancellation systems in accordance with the above-described embodiments are implemented. The manner of implementation may be determined arbitrarily depending on the structure, use, or the like of an apparatus or system to which a noise cancellation system in accordance with the present invention is applied.

For example, in the case where a headphone device that fulfills a noise cancellation function by itself is constructed, most of the parts that form the noise cancellation system may be contained in the housing of the headphone device. In the case where a noise cancellation system is formed by a combination of a headphone device and an external device such as an adapter, at least one part other than the microphone and the driver may be provided in the external device such as the adapter.

Further, in the case where a noise cancellation system is implemented on a mobile phone device, a network audio communication device, an audio player, or the like that is configured to reproduce audio content and output the reproduced content to a headphones terminal, for example, at least one part other than the microphone and the driver may be provided in such a device.

Also note that it is assumed in the above-described embodiments that an audio signal having a signal characteristic for canceling the noise is generated in the noise cancellation-use digital filter. However, an inverting amplifier may be adopted as the amplifier 12, and the noise cancellation-use digital filter may be formed as a digital filter having a desired frequency characteristic, such as an LPF, for example. In this case also, an equivalent noise cancellation-use signal can be obtained.

It should be understood by those skilled in the art that various modifications, combinations, sub-combinations and alterations may occur depending on designs and other factors insofar as they are within the scope of the appended claims or the equivalents thereof.

What is claimed is:

1. A signal processing apparatus comprising:

analog-to-digital conversion means for performing a first delta sigma modulation process of generating a digital signal having a predetermined sampling frequency and a predetermined quantization bit rate of one or more bits based on an input analog signal;

signal processing means including a digital filter to allow a delay time between input and output to be restricted within a predetermined range and having a predetermined characteristic for outputting a digital signal having a sampling frequency of n×Fs where n is a natural number and Fs is a predetermined reference sampling frequency and a predetermined quantization bit rate of a bits where a is a natural number greater than one based on the digital signal generated by said analog-to-digital conversion means; and digital-to-analog conversion means including a part for performing a second delta sigma modulation process for outputting a digital signal having a sampling frequency of n×Fs and a predetermined quantization bit rate of b bits where b is a natural number greater than zero and less than a based on a digital signal outputted from said signal processing means.

2. The signal processing apparatus according to claim 1, wherein the characteristic of the digital filter included in said signal processing means is a characteristic for attenuating a noise signal based on the input analog signal, the input analog signal being a signal outputted from sound pickup means provided on a feedforward noise cancellation headphone device for picking up a noise.

3. The signal processing apparatus according to claim 1, wherein the characteristic of the digital filter included in said signal processing means is a characteristic for attenuating a noise signal based on the input analog signal, the input analog signal being a signal outputted from sound pickup means provided on a feedback noise cancellation headphone device for picking up a noise.

4. The signal processing apparatus according to claim 1, wherein the digital filter included in said signal processing means includes:

a shift register having a predetermined number of taps for accepting input of sample data of the digital signal to be inputted to the digital filter; and data processing means for holding, in a predetermined storage area, pieces of output data composed of bits corresponding in number to the quantization bit rate of the digital signal outputted from the digital filter such that each piece of output data is held at a separate address, and reading, from the storage area, one of the pieces of output data held in an address specified by an output from the shift register and allowing this piece of output data to be outputted from the digital filter.

5. The signal processing apparatus according to claim 1, wherein the digital filter included in said signal processing means has a function as a decimation filter, and said signal processing means further comprises:

upsampling means for raising the sampling frequency of the digital signal outputted from the digital filter to a sampling frequency with which the signal should be inputted to the part for performing the second delta sigma modulation process.

6. The signal processing apparatus according to claim 5, wherein said digital-to-analog conversion means further comprises:

an oversampling filter to perform oversampling based on a digital signal other than the digital signal outputted from said signal processing means using a predetermined number of upsampling circuits connected in series, and outputting a result to the part for performing the second delta sigma modulation process, and the upsampling means is formed by using at least one of the upsampling circuits in accordance with the sampling frequency with which the signal should be inputted to the part for performing the second delta sigma modulation process.

7. The signal processing apparatus according to claim 1, further comprising:

filter coefficient adjusting means for adjusting a coefficient of the digital filter when a predetermined state of the digital signal to be inputted to the digital filter included in said signal processing means has been detected.

8. The signal processing apparatus according to claim 1, further comprising:

first filter output level adjusting means for adjusting a level of the digital signal outputted from the digital filter when a predetermined state of the digital signal to be inputted to the digital filter included in said signal processing means has been detected.

9. The signal processing apparatus according to claim 1, further comprising:

second filter output level adjusting means for adjusting a level of the digital signal outputted from the digital filter when a level of another digital signal to be combined with the digital signal outputted from said signal processing means has been detected.

10. A signal processing method, comprising:

an analog-to-digital conversion step of performing a first delta sigma modulation process of generating a digital signal having a predetermined sampling frequency and a predetermined quantization bit rate of one or more bits based on an input analog signal;

a signal processing step, performed by a digital filter to allow a delay time between input and output to be restricted within a predetermined range and having a predetermined characteristic, of outputting a digital signal having a sampling frequency of n×Fs where n is a natural number and Fs is a predetermined reference sampling frequency and a predetermined quantization bit rate of a bits where a is a natural number greater than one based on the digital signal generated in said analog-to-digital conversion step; and a digital-to-analog conversion step, performed by a part for performing a second delta sigma modulation process, of outputting a digital signal having a sampling frequency of n×Fs and a predetermined quantization bit rate of b bits where b is a natural number greater than zero and less than a based on a digital signal obtained in said signal processing step.

11. A signal processing apparatus comprising:

an analog-to-digital conversion section configured to perform a first delta sigma modulation process of generating a digital signal having a predetermined sampling frequency and a predetermined quantization bit rate of one or more bits based on an input analog signal;

a signal processing section including a digital filter to allow a delay time between input and output to be restricted within a predetermined range and having a predetermined characteristic for outputting a digital signal having a sampling frequency of n×Fs where n is a natural number and Fs is a predetermined reference sampling frequency and a predetermined quantization bit rate of a bits where a is a natural number greater than one based on the digital signal generated by said analog-to-digital conversion section; and a digital-to-analog conversion section including a part for performing a second delta sigma modulation process for outputting a digital signal having a sampling frequency of n×Fs and a predetermined quantization bit rate of b bits where b is a natural number greater than zero and less than a based on a digital signal outputted from said signal processing section.

12. The signal processing apparatus according to claim 11, wherein the characteristic of the digital filter included in said signal processing section is a characteristic for attenuating a noise signal based on the input analog signal, the input analog signal being a signal outputted from a sound pickup section provided on a feedforward noise cancellation headphone device for picking up a noise.

13. The signal processing apparatus according to claim 11, wherein the characteristic of the digital filter included in said signal processing section is a characteristic for attenuating a noise signal based on the input analog signal, the input analog signal being a signal outputted from a sound pickup section provided on a feedback noise cancellation headphone device for picking up a noise.

14. The signal processing apparatus according to claim 11, wherein the digital filter included in said signal processing section further comprises:

a shift register having a predetermined number of taps configured to accept input of sample data of the digital signal to be inputted to the digital filter; and a data processing section configured to hold, in a predetermined storage area, pieces of output data composed of bits corresponding in number to the quantization bit rate of the digital signal outputted from the digital filter such that each piece of output data is held at a separate address, and read, from the storage area, one of the pieces of output data held in an address specified by an output from the shift register and allow this piece of output data to be outputted from the digital filter.

15. The signal processing apparatus according to claim 11, wherein the digital filter included in said signal processing section has a function as a decimation filter, and said signal processing section further comprises:

an upsampling section configured to raise the sampling frequency of the digital signal outputted from the digital filter to a sampling frequency with which the signal should be inputted to the part for performing the second delta sigma modulation process.

16. The signal processing apparatus according to claim 15, wherein said digital-to-analog conversion section further comprises:

an oversampling filter configured to perform oversampling based on a digital signal other than the digital signal outputted from said signal processing section using a predetermined number of upsampling circuits connected in series, and output a result to the part for performing the second delta sigma modulation process, and the upsampling section is formed by using at least one of the up sampling circuits in accordance with the sampling frequency with which the signal should be inputted to the part for performing the second delta sigma modulation process.

17. The signal processing apparatus according to claim 11, further comprising;

a filter coefficient adjusting section configured to adjust a coefficient of the digital filter when a predetermined state of the digital signal to be inputted to the digital filter included in said signal processing section has been detected.

18. The signal processing apparatus according to claim 11, further comprising:

a first filter output level adjusting section configured to adjust a level of the digital signal outputted from the digital filter when a predetermined state of the digital signal to be inputted to the digital filter included in said signal processing section has been detected.

19. The signal processing apparatus according to claim 11, further comprising:

a second filter output level adjusting section configured to adjust a level of the digital signal outputted from the digital filter when a level of another digital signal to be combined with the digital signal outputted from said signal processing section has been detected.

* * * * *